(12) United States Patent
Jo et al.

(10) Patent No.: US 7,617,587 B2
(45) Date of Patent: Nov. 17, 2009

(54) APPARATUS FOR SUPPORTS A PRINTER CIRCUIT BOARD SUBSTRATE

(75) Inventors: Min-hyun Jo, Seongnam-si (KR);
Weon-woo Nam, Seoul (KR); Joo-han Kim, Bucheon-si (KR)

(73) Assignees: Samsung Techwin Co., Ltd., Changwon (KR); Phoenix Digital Tech Co., Ltd., Pyongtaek (KR)

( * ) Notice: Subject to any disclaimer, the term of this patent is extended or adjusted under 35 U.S.C. 154(b) by 361 days.

(21) Appl. No.: 11/708,791

(22) Filed: Feb. 20, 2007

(65) Prior Publication Data

US 2008/0087178 A1    Apr. 17, 2008

(30) Foreign Application Priority Data

Oct. 13, 2006  (KR) ............... 10-2006-0100013

(51) Int. Cl.
*B23P 23/00* (2006.01)
(52) U.S. Cl. .................. 29/564.2; 29/740; 29/741; 29/742; 29/743
(58) Field of Classification Search ............... 29/564.2, 29/740, 742, 759, 729, 744, 749, 743; 198/817, 198/861.1, 465.3, 341.05; 361/710, 704, 361/707, 718; 414/403, 331.01; 257/718, 257/719
See application file for complete search history.

(56) References Cited

U.S. PATENT DOCUMENTS

| 6,324,752 | B1 * | 12/2001 | Wesseling et al. | 29/740 |
| 6,453,548 | B1 * | 9/2002 | Hidese | 29/832 |
| 6,568,069 | B1 * | 5/2003 | Melf et al. | 29/740 |
| 6,769,534 | B2 * | 8/2004 | Lee | 198/817 |

* cited by examiner

*Primary Examiner*—Derris H Banks
*Assistant Examiner*—Tai Nguyen
(74) *Attorney, Agent, or Firm*—Drinker Biddle & Reath LLP

(57) ABSTRACT

An apparatus is provided for supporting a PCB substrate during printing. The apparatus includes first and second fixing units that cooperate to edge-clamp the substrate. The first fixing unit includes a first movable plate, a first actuator, and a first stopper that limits outward movement of the first movable plate. The second fixing unit includes a second movable plate, a second actuator, and a second stopper that limits outward movement of the second movable plate. When printing the substrate from the first edge to the second edge, the first and second fixing units operate so that the second actuator moves the second movable plate outwardly to contact the second stopper, and the first actuator moves the first movable plate inwardly to press the substrate toward the second movable plate. When printing the substrate from the second edge to the first edge the first and second fixing units operate oppositely.

7 Claims, 8 Drawing Sheets

APPARATUS FOR SUPPORTS A PRINTER CIRCUIT BOARD SUBSTRATE

CROSS-REFERENCE TO RELATED PATENT APPLICATION

This application claims the benefit of Korean Patent Application No. 10-2006-0100013, filed on Oct. 13, 2006, in the Korean Intellectual Property Office, the disclosure of which is incorporated herein in its entirety by reference.

BACKGROUND OF THE INVENTION

1. Field of the Invention

The present invention relates generally to printed circuit boards (PCBs). More particularly, the present invention relates to an apparatus for supporting a PCB substrate while a printing apparatus applies solder paste on a surface of the substrate, and a method of forming the PCB using the apparatus.

2. Description of the Related Art

Various electronic components are mounted on a surface of a printed circuit board (PCB). Conventionally, PCBs are mass-produced by automated equipment through various processes including a screen printing process, a component mounting process, a reflow process, etc.

In the screen printing process of PCB mass production, solder paste in a melted state is applied in a predetermined pattern on a substrate surface so that various electronic components of various shapes may be surface-mounted on the PCB to be in communication with each other. The solder paste is applied using an apparatus called a screen printer. The screen printer presses the solder paste supplied on a mask or a screen having a predetermined pattern with a squeegee and applies the pressed solder paste on the PCB.

When the solder paste is applied on the substrate, a PCB supporting apparatus operates to fix (i.e., hold stationary, clamp or secure) the PCB so that the PCB does not move. The PCB supporting apparatus includes an air cylinder pressing a side surface of the PCB to fix the PCB in order to minimize a movement of the PCB during a printing process.

FIG. 1 is a plan view illustrating a conventional PCB supporting apparatus and FIG. 2 is a side view illustrating the PCB supporting apparatus of FIG. 1.

The conventional PCB supporting apparatus presses side surfaces or edges of a PCB 10 to fix the PCB 10. The conventional PCB supporting apparatus includes a stationary plate 11 supporting one edge of the PCB 10 and a movable plate 12 pressing the other edge of the PCB 10. The movable plate 12 is operated by an air cylinder 13 to press the other edge of the PCB 10. When the PCB 10 is pressed and fixed between the stationary plate 11 and the movable plate 12, a printing operation of applying solder paste on the PCB 10 is then performed.

In the printing operation of applying solder paste on the PCB 10, the solder paste that is supplied on a mask or screen is pressed on the PCB 10 by a squeegee. Therefore, a pressure is applied to the PCB 10 in a printing direction, that is, a direction towards where the squeegee presses the solder paste on the PCB 10.

A squeezing pressure ranges from 3 to 20 kg/cm$^2$. On the other hand, the pressure applied to the movable plate 12 by the air cylinder 13 is at the most approximately 2 kg/cm$^2$. Therefore, when the printing operation of applying solder paste on the PCB 10 is performed and a high squeezing pressure is applied while the air cylinder 13 presses and supports the PCB 10 with low pressure, the PCB 10 may move when, for example, the printing direction is from the stationary plate 11 toward the movable plate 12.

If the PCB 10 moves in the printing direction when printing for minute components (e.g., having dimensions of approximately 0.3-0.6 mm) is performed on the PCB 10, a small movement of the PCB 10 in the printing direction greatly affects the printing operation, and thus degrades the printing quality.

The pressure applied to the PCB 10 by the air cylinder 13 may be increased in order to prevent the PCB 10 from moving, but the PCB 10 may be bent, bowed or damaged due to the applied high pressure.

SUMMARY OF THE INVENTION

According to an aspect of the present invention, there is provided an apparatus that supports a substrate during a printing operation for printed circuit board (PCB) formation. An example apparatus includes: a first fixing unit including a first movable plate that engages the first edge of the PCB substrate, a first actuator that moves the first movable plate in a first inward direction toward the first edge and a first outward direction away from the first edge, and a first stopper that limits movement of the first movable plate in the first outward direction; and a second fixing unit including a second fixing unit generally parallel with and spaced apart from the first fixing unit, the second fixing unit including a second movable plate that engages the second edge of the PCB substrate, a second actuator that moves the second movable plate in a second inward direction toward the second edge and a second outward direction away from the second edge, and a second stopper that limits movement of the second movable plate in the second outward direction. When solder paste is printed on the PCB substrate from the first edge to the second edge, the apparatus operates such that the second actuator moves the second movable plate in the second outward direction to contact the second stopper, and the first actuator moves the first movable plate in the first inward direction to press the PCB substrate toward the second movable plate. Similarly, when solder paste is printed on the PCB substrate from the second edge to the first edge, the apparatus operates such that the first actuator moves the first movable plate in the first outward direction to contact the first stopper, and the second actuator moves the second movable plate in the second inward direction to press the PCB substrate toward the first movable plate.

The apparatus may further include a PCB conveying apparatus that delivers the PCB between the first and second fixing units.

The apparatus may further include a lower support unit that supports a bottom surface of the PCB and which adjusts the height of the PCB to correspond substantially with the height of the first and second movable plates of the first and second fixing units.

The apparatus may further include a vacuum nozzle that applies a vacuum pressure to the bottom surface of the PCB.

The first and second fixing units may be movable relative to each other such that a distance between the first and second fixing units is adjusted to correspond to the width of the PCB.

According to another aspect of the present invention, there is provided a method of forming of a printed circuit board (PCB) using the apparatus for supporting a PCB, the apparatus including first and second fixing units, the method including: loading a PCB in a predetermined region of the apparatus between the first and second fixing units; determining whether a printing direction of a printing apparatus is a first direction proceeding from a first side of the PCB to a second side of the PCB or a second direction from the second side of the PCB to the first side of the PCB; when the printing direction of the printing apparatus is the second direction, fixing a first fixing unit to support the first side of the PCB, and pressing the PCB toward the first fixing unit with the second fixing unit; when the printing direction is the first direction, fixing the second fixing unit to support the second side of the PCB, and pressing the PCB toward the second fixing unit with the first fixing unit; and performing a printing operation by applying solder paste on the PCB with the printing apparatus.

The loading of the PCB may include conveying the PCB between the first and second fixing units by a PCB conveying apparatus.

The performing of the printing operation may include aligning the PCB before applying the solder paste on the PCB.

The performing of the printing operation may further include supporting the PCB by applying a vacuum to a bottom pressure surface of the PCB after the aligning of the PCB.

In the method, the first fixing unit may include a first movable plate that engages the first edge of the PCB substrate, a first actuator that moves the first movable plate in a first inward direction toward the first edge and a first outward direction away from the first edge, and a first stopper that limits movement of the first movable plate in the first outward direction, and the second fixing unit may include a second movable plate that engages the second edge of the PCB substrate, a second actuator that moves the second movable plate in a second inward direction toward the second edge and a second outward direction away from the second edge, and a second stopper that limits movement of the second movable plate in the second outward direction, and the fixing of the first fixing unit and the second fixing unit may be performed using a driving force applied from the first and second actuators

DETAILED DESCRIPTION OF THE EMBODIMENTS

The present invention will now be described more fully with reference to the accompanying drawings, in which exemplary embodiments of the invention are shown.

Figure 1:
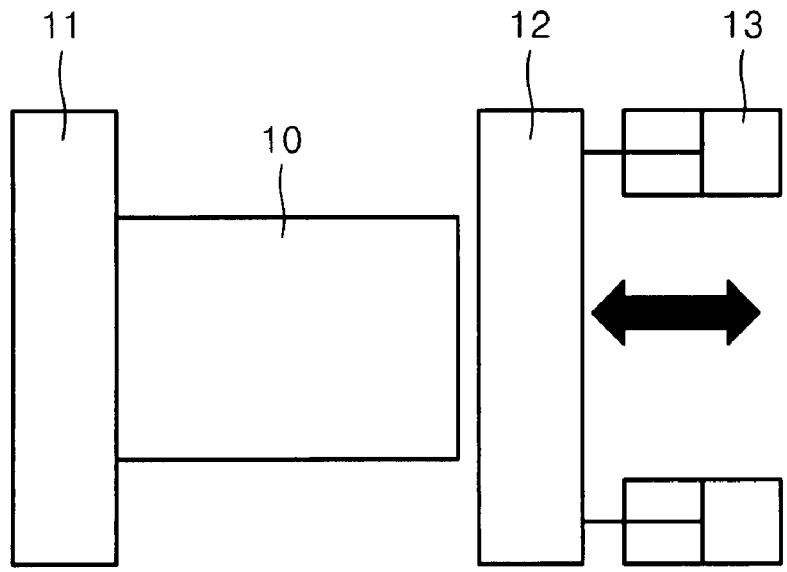
FIG. 1 is a plan view illustrating a conventional printed circuit board (PCB) supporting apparatus.
Figure 2:
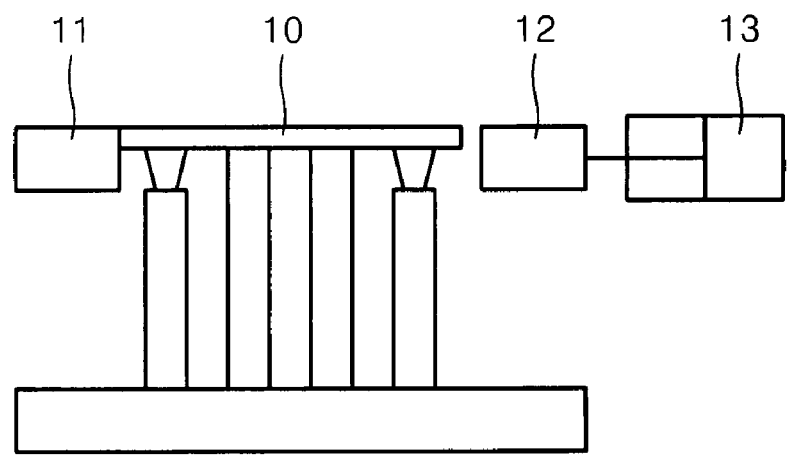
FIG. 2 is a side view illustrating the conventional PCB supporting apparatus of FIG. 1.
Figure 3:
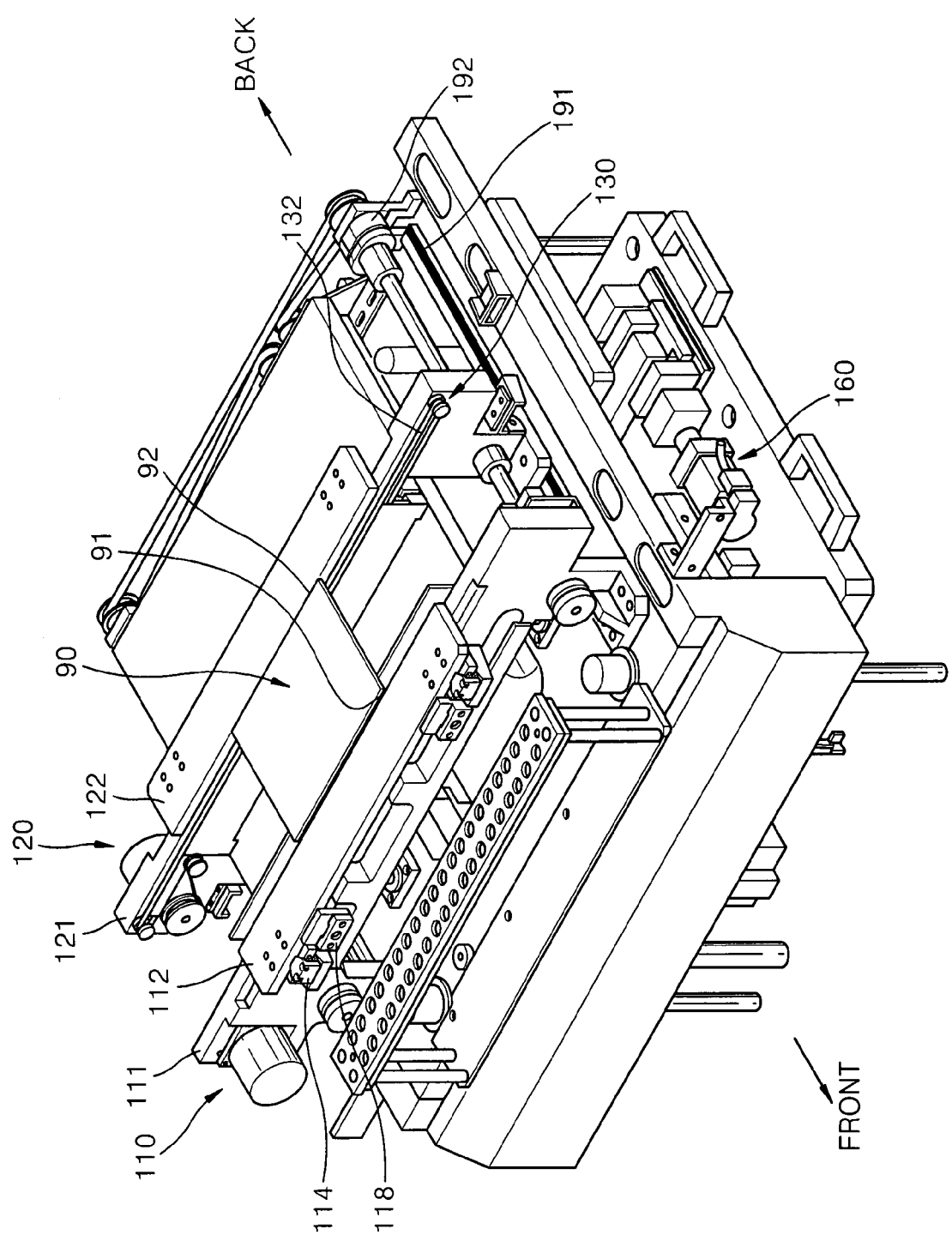
FIG. 3 is a perspective view illustrating an example printing apparatus including a PCB supporting apparatus according to an embodiment of the present invention.
Figure 4:
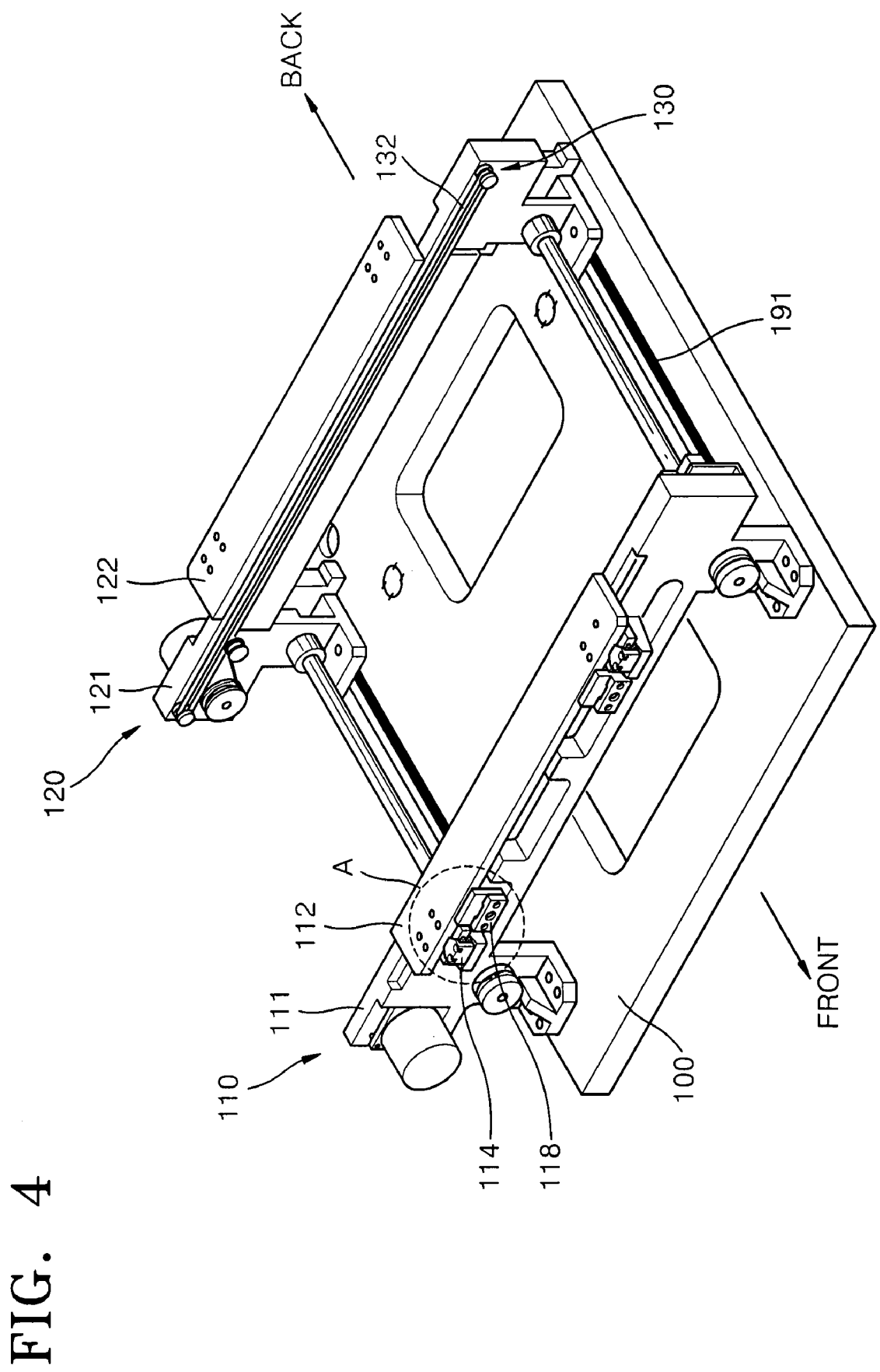
FIG. 4 is a partial perspective view illustrating the PCB supporting apparatus illustrated in FIG. 3.
Figure 5:
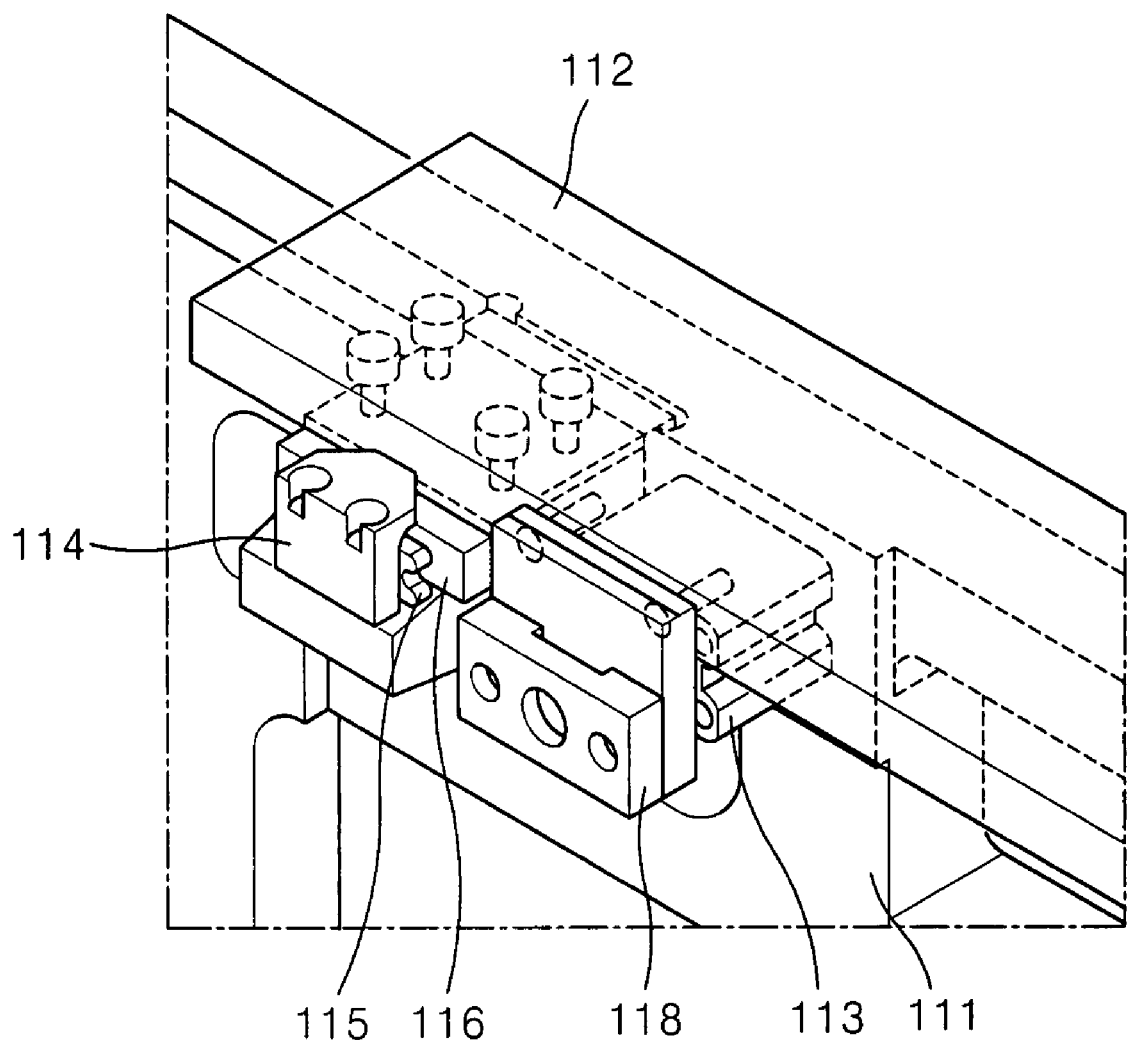
FIG. 5 is an enlarged perspective view illustrating part "A" of the PCB supporting apparatus illustrated FIG. 4.
Figure 6:
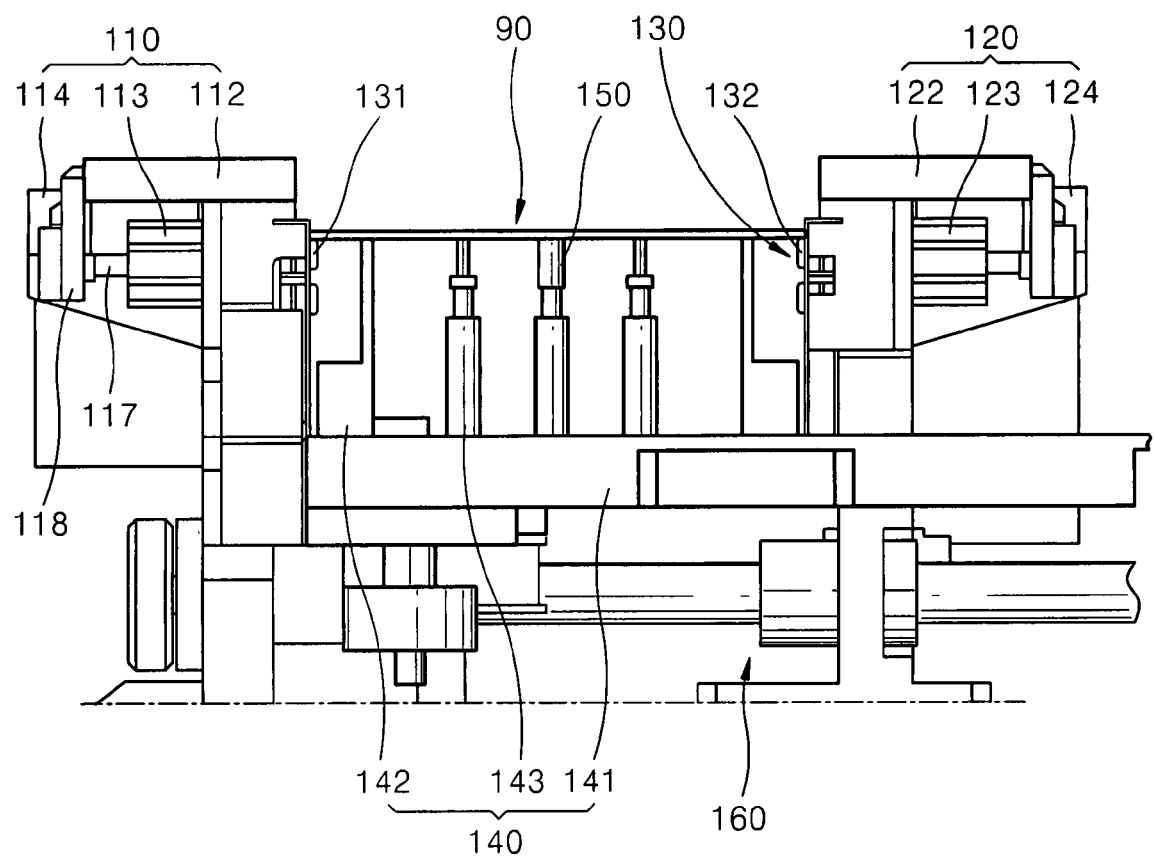
FIG. 6 is a side elevation view illustrating the PCB supporting apparatus with a PCB conveyed illustrated in FIG. 3.

FIG. 3 is a perspective view illustrating a printing apparatus including an example printed circuit board (PCB) supporting apparatus according to an aspect of the present invention, FIG. 4 is a perspective view illustrating the PCB supporting apparatus illustrated in FIG. 3, FIG. 5 is an enlarged perspective view illustrating part "A" of the PCB supporting apparatus illustrated FIG. 4, and FIG. 6 is a side elevation view illustrating the PCB supporting apparatus with a PCB conveyed illustrated in FIG. 3. For sake of convenience, the terms substrate and PCB will be used somewhat interchangeably herein since it should be appreciated that the present apparatus receives substrates for the purpose of facilitating the printing of circuit traces thereon and, thereby, forming PCBs.

Referring to FIGS. 3 through 6, the PCB supporting apparatus includes a first fixing unit 110 and a second fixing unit 120. The PCB supporting apparatus fixes (i.e., holds stationary, clamps, retains, secures) the PCB 90 between the first and second fixing units 110 and 120 while the printing apparatus performs a printing operation (i.e., applying solder paste) on the PCB 90. Therefore, the first and second fixing units 110 and 120 are configured to be generally parallel to each other, spaced apart a predetermined distance, and facing each other so as to support the first edge 91 (front edge according to arrow labelled "FRONT" in FIG. 3) and the second edge 92 (back edge according to arrow labelled "BACK" in FIG. 3) of the PCB 90, respectively.

The first fixing unit 110 of the PCB supporting apparatus supports the first edge 91 of the PCB 90 and includes a first movable plate 112, a first actuator 113 and a first stopper 114. The first movable plate 112 of the first fixing unit 110 is movably mounted, coupled or otherwise configured on a first guide unit 111 for horizontal movement in the y-axis direction. As shown in FIG. 4, the first guide unit 111 is mounted on a base 100. The first movable plate 112 of the first fixing unit 110 may move along the y-axis in an inward (i.e., backward) direction towards the first edge 91 of the PCB 90, and an outward (i.e., frontward) direction away from the first edge 91 of the PCB 90. As best illustrated in FIGS. 3 and 4, the first movable plate 112 extends in the x-axis direction along a substantial length of the guide unit 111.

Various means or devices may be employed to move the first movable plate 112 of the first fixing unit 110 in the y-axis direction on the first guide unit 111 but in the illustrated embodiment, a linear movement guide 115 and guide block 116 are used to facilitate movement of the first movable plate 112 in an inward and outward direction on the first guide unit 111. The linear movement guide 115 is mounted on the first guide unit 111, and a slidable guide block 116 is coupled to the linear movement guide 115 and is mounted on the first movable plate 112. Therefore, the first movable plate 112 may move in an inward and outward direction along with the linear movement guide 115.

The first actuator 113 of the first fixing unit 110 is mounted on the first guide unit 111 and is connected to the first movable plate 112 to supply a driving force to the first movable plate 112. In an embodiment, the first actuator 113 of the first fixing unit 110 comprises an air (i.e., pneumatic) cylinder, and a cylinder rod 117 of the air cylinder is connected to the first movable plate 112 through a connecting block 118. Therefore, when the cylinder rod 117 of the air cylinder extends or retracts by an operation of the first actuator 113, a driving force is transferred to the first movable plate 112, and thereby moving the first movable plate 112 on the first guide unit 111. In other embodiments, the first actuator 113 may be other suitable devices such as electric actuators, hydraulic actuators, etc.

The first stopper 114 of the first fixing unit 110 is mounted on an outer portion of the linear movement guide 115. The first stopper 114 limits an outward movement of the first movable plate 112 away from the first edge 91 of the PCB 90. When the first movable plate 112 moves outward away from the first edge 91 of the PCB 90 due to the first actuator 113 and reaches the first stopper 114, the first movable plate 112 is stopped. Therefore the first movable plate 112 cannot move outward away from the first edge 91 of the PCB 90 anymore due to the first stopper 114. In such a stopped state, the first movable plate 112 is configured to best support the first edge 91 of the PCB 90.

The second fixing unit 120 of the PCB supporting apparatus is configured generally parallel to, and spaced apart from the first fixing unit 110 to support the second edge 92 of the PCB 90. The second fixing unit 120 includes a second movable plate 122, a second actuator 123 and a second stopper 124 (refer to FIGS. 7 and 9). As can be appreciated, the second fixing unit 120 of the PCB supporting apparatus is substantially similar to or a substantial mirror-image of the first fixing unit 110.

The second movable plate 122 of the second fixing unit 120 is mounted on a second guide unit 121 mounted on the base 100 and can horizontally move along the y-axis direction. The second movable plate 122 may move in an inward (i.e., frontward) direction towards the second edge 92 of the PCB 90, and an outward (i.e., backward) direction away from the second edge 92 of the PCB 90. As best illustrated in FIGS. 3 and 4, the second movable plate 122 extends in the x-axis direction along a substantial length of the second guide unit 121.

The second movable plate 122 is moved by the second actuator 123, and is coupled to a linear movement guide (not shown) mounted in the second guide unit 121 to move in an inward or outward direction towards and away from the second edge 92 of the PCB 90. The second stopper 124 is mounted on the linear movement guide to limit an outward movement of the second movable plate 122 away from the second edge 92 of the PCB 90.

In an embodiment, the first and second fixing units 110 120 may be movable relative to each other on the base 100 such that a distance between the first and second guide units 111, 121 may be adjusted. As best shown in FIGS. 3 and 4, in one embodiment, the second guide unit 121 may move by sliding along a guide 191 of the base 100, and may be driven by a motor 192 to move toward or away from the first guide unit 111.

A PCB conveying apparatus 130 may be mounted between the first and second fixing units 110 and 120. In an embodiment, the PCB conveying apparatus 130 may include a first conveyor belt 131 mounted on the first guide unit 111 and a second conveyor belt 132 mounted on the second guide unit 121 (refer to FIG. 6). The first conveyor belt 131 supports a bottom surface of one side of the PCB 90 proximate to edge 91, and the second conveyor belt 132 supports a bottom surface of the other side of the PCB 90 proximate to edge 92. Therefore, when the first and second conveyor belts 131 and 132 rotate, the PCB 90 is conveyed, oriented, configured or otherwise delivered between the first and second fixing units 110 and 120.

The PCB supporting apparatus may further include a lower support unit 140 (refer to FIG. 6) that is configured to support a bottom surface of the PCB 90. The lower support unit 140 supports the bottom surface of the PCB 90 by moving in an upward direction under the PCB 90, and thus may adjust the height of the PCB 90 to generally correspond to the height of the first and second movable plates 112 and 122 such that the PCB 90 is, for example, substantially coplanar with the plates 112, 122. That is, when the PCB 90 is conveyed between the first and second fixing units 110 and 120, the lower support unit 140 rises to support the PCB 90 and adjust the height of the PCB 90.

The lower support unit 140 includes a vertical movable plate 141 that moves in upward and downward directions from the base 100. The lower support unit 140 further includes support wings 142 and support pins 143 that extend in an upward direction from the vertical movable plate 141. The support wings 142 support both sides of the bottom surface of the PCB 90, and the support pins 143 support a center portion of the bottom surface of the PCB 90.

The PCB supporting apparatus may further include a vacuum nozzle 150 that vertically fixes the PCB 90 by applying a vacuum to the bottom surface of the PCB 90. The vacuum nozzle 150 can move in upward or downward directions together with the lower support unit 140, such that the vacuum nozzle 150 fixes the PCB 90 by applying vacuum pressure to the bottom surface of the PCB 90 after the support wings 142 and the support pins 143 contact the bottom surface of the PCB 90.

An operation of the apparatus for supporting the PCB having the above-mentioned structure will now be described.

The PCB 90 is loaded on the PCB conveying apparatus 130 of the PCB supporting apparatus, and conveyed between the first and second fixing units 110 and 120. Before loading the PCB 90, a distance between the first and second guide units 111 and 121 may be adjusted to generally correspond to the width of the PCB 90 (i.e., the distance between edges 91 and 92) by moving, for example, in one embodiment, the second guide unit 121 toward or away from the first guide unit 111.

Front and back ends of the bottom surface of the PCB 90 are supported by the first and second conveyor belts 131 and 132 of the PCB conveying apparatus 130. Therefore, when the first and second conveyor belts 131 and 132 of the PCB conveying apparatus 130 rotate, the PCB 90 is conveyed between the first and second fixing units 110 and 120.

The first and second conveyor belts 131 and 132 of the PCB conveying apparatus 130 are configured to be lower than the first and second fixing plates 112 and 122, such that the PCB 90 does not interfere with other parts such as the first and second fixing plates 112 and 122 while being conveyed by the first and second conveyor belts 131 and 132. The lower support unit 140 adjusts the height of the conveyed PCB 90 to be substantially coplanar with the plates 112, 122 of first and second fixing units 110 and 120. When the lower support unit 140 moves in an upward direction under the PCB 90, the PCB 90 is supported by the support wings 142 and the support pins 143 that extend upward from the vertical movable plate 141. The lower support unit 140 rises until the first and second sides of the PCB 90 are substantially coplanar with the first and second movable plates 112 and 122.

Figure 7:
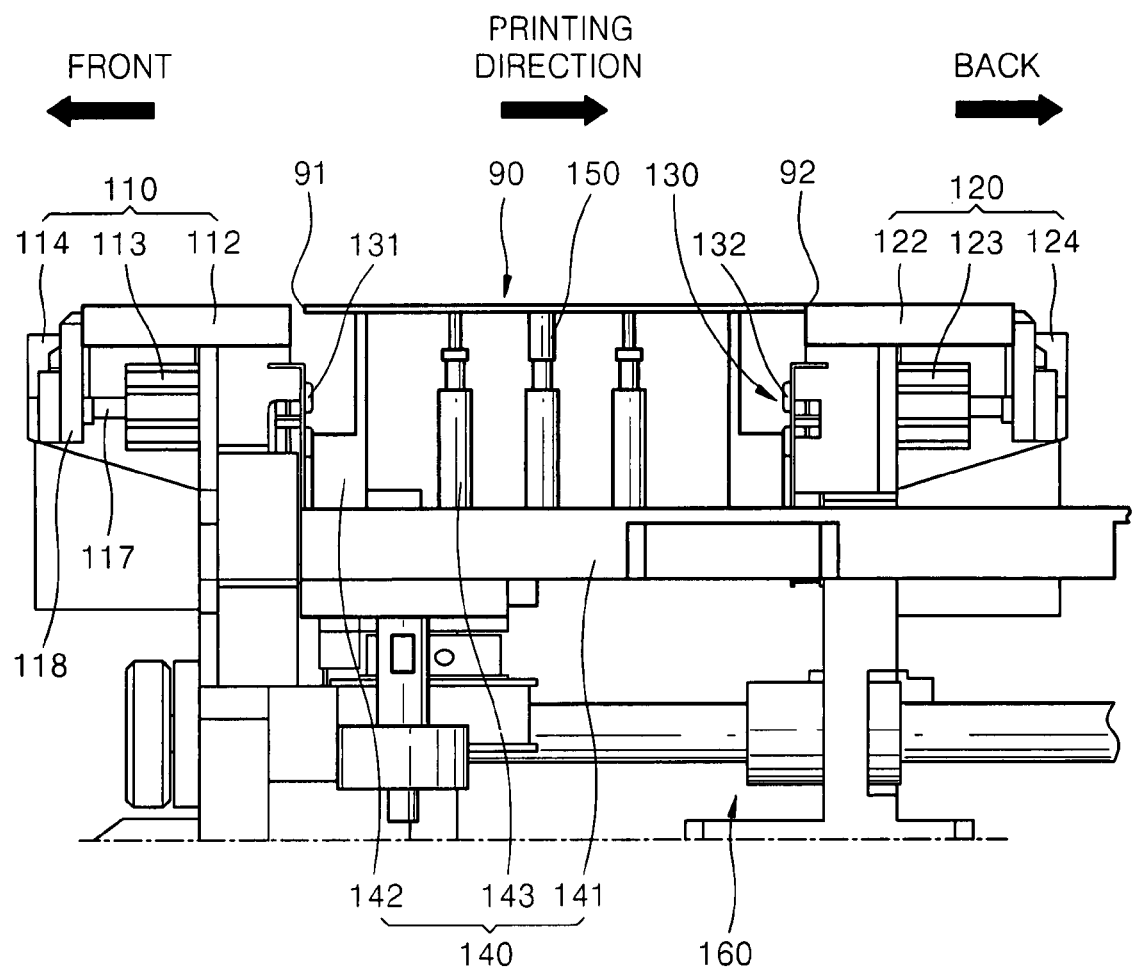
FIG. 7 is a side elevation view illustrating the PCB supporting apparatus in FIG. 3 performing a printing operation from front to back invention.
Figure 8:
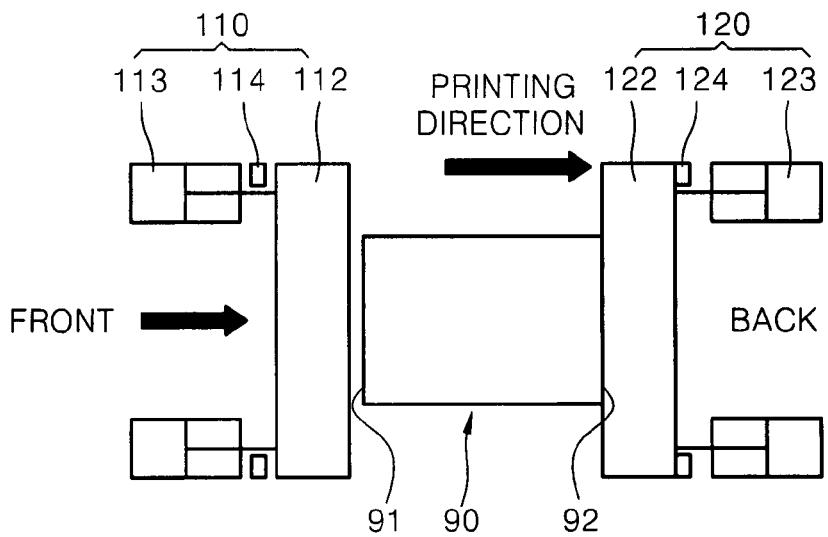
FIG. 8 is a plan view schematically illustrating an operation state of the PCB supporting apparatus illustrated in FIG. 7.

FIG. 7 is a side elevation view illustrating the PCB supporting apparatus in FIG. 3 performing a printing operation in a front to back printing direction, and FIG. 8 is a plan view schematically illustrating an operation state of the PCB supporting apparatus illustrated in FIG. 7.

When the PCB 90 is substantially coplanar with the first and second movable plates 112 and 122, the PCB 90 is supported therebetween according to a printing direction. In a printing operation, solder paste is applied on a surface of the PCB 90. When solder paste is pressed on the PCB 90 by a squeegee, the printing direction of the solder paste may be from front to back of the PCB 90 or from back to front of the PCB 90. A pressure is applied to the PCB 90 in the printing direction due to the squeegee, which causes the PCB 90 to move in the printing direction. To prevent movement of the PCB 90, the moving direction of the PCB 90 is determined according to the printing direction, and the first and second fixing units 110 and 120 operate in order to prevent a movement of the PCB 90.

When the printing direction is from the first edge 91 of the PCB 90 to the second edge 92 of the PCB 90, that is, from front to back, the PCB 90 tends to move backward due to pressure from the printing apparatus. In this case, the second movable plate 122 supporting the second edge 92 of the PCB 90 and the second stopper 124 operate such that the PCB 90 does not move in the printing direction.

In this case, the second actuator 123 operates to move the second movable plate 122 in an outward direction such that a rear surface of the second movable plate 122 contacts the second stopper 124. When the rear surface of the second movable plate 122 contacts the second stopper 124, the second movable plate 122 cannot move anymore in an outward direction since the second stopper limits the outward movement of the second movable plate 122.

When the second movable plate 122 and the second actuator 123 has stopped operating, the first actuator 113 operates to move the first movable plate 112 in an inward direction, and thereby pressing or clamping the PCB 90 between the plates 112, 122. As shown in FIGS. 7 and 8, the PCB 90 is supported by the support wings 142 and the support pins 143 of the lower support unit 140, but is not fixed. Accordingly, when the first movable plate 112 presses the first edge 91 of the PCB 90, the PCB 90 moves toward the second movable plate 122 and thus the second edge 92 contacts the second movable plate 122.

In this state, since the second edge 92 of the PCB 90 contacts the second movable plate 122 and the PCB 90 does not move further in a backward direction. Accordingly, the PCB supporting apparatus can stably support the PCB 90 during the printing operation.

Figure 9:
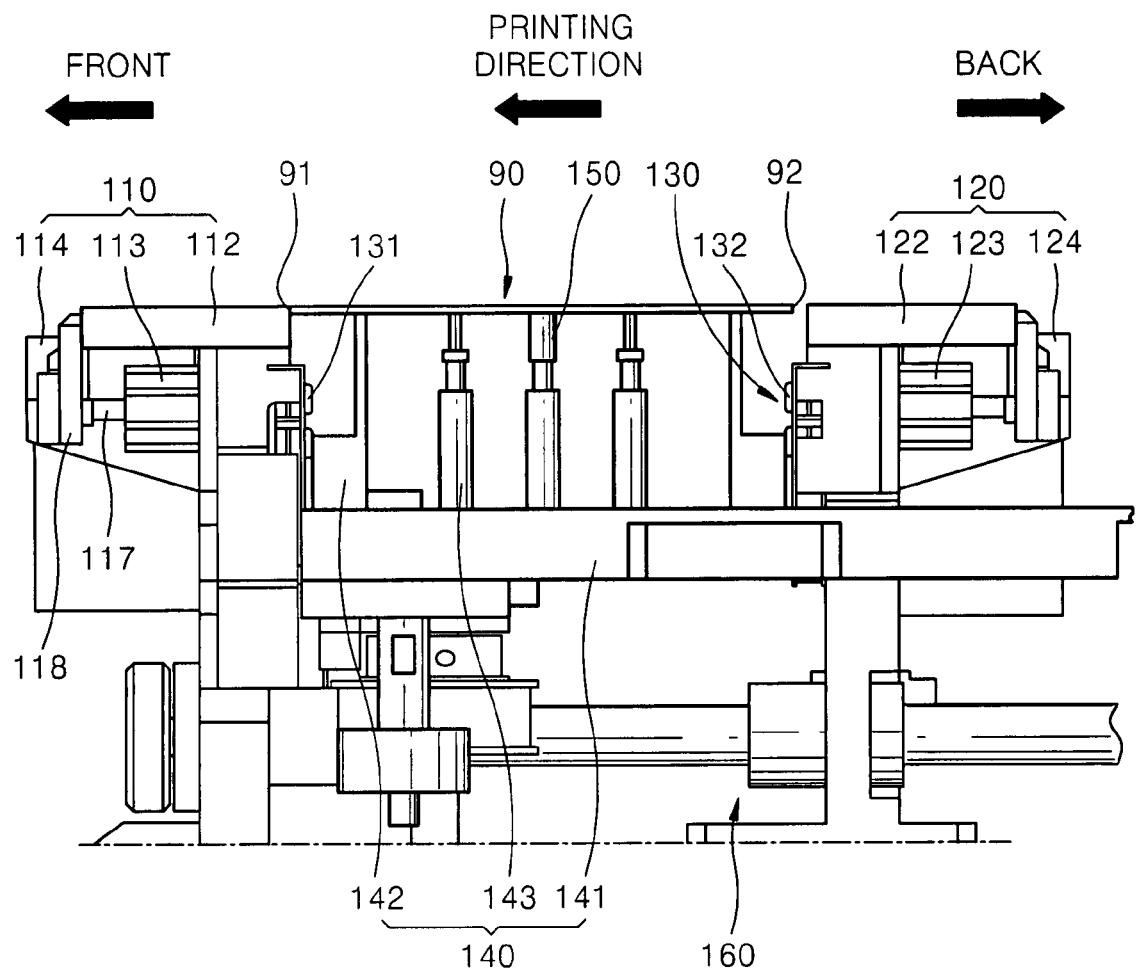
FIG. 9 is a side elevation view illustrating the PCB supporting apparatus in FIG. 3 performing a printing operation from back to front.
Figure 10:
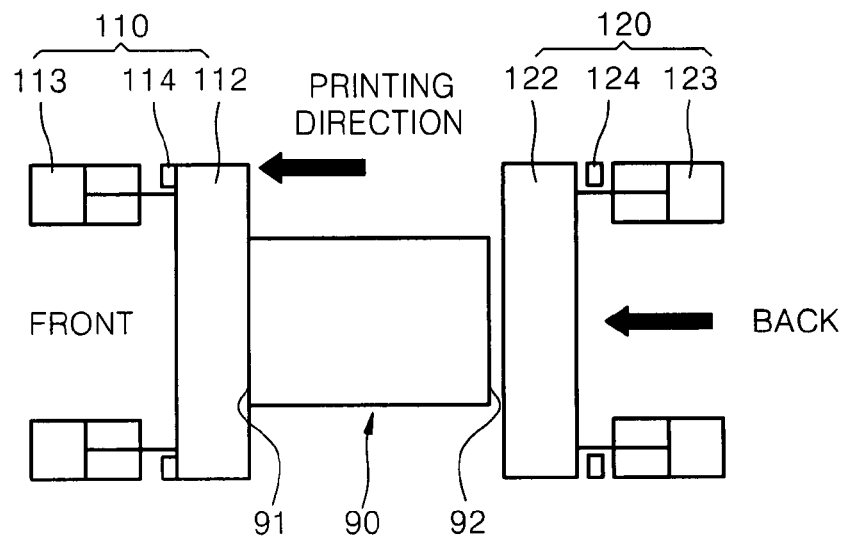
FIG. 10 is a plan view schematically illustrating an operation state of the PCB supporting apparatus illustrated in FIG. 9.

FIG. 9 is a side elevation view illustrating the PCB supporting apparatus in FIG. 3 performing a printing operation in a back to front printing direction, and FIG. 10 is a plan view schematically illustrating an operation state of the PCB supporting apparatus illustrated in FIG. 9.

When the printing direction is from the second edge 92 to the first edge 91 of the PCB 90, that is, from back to front, the PCB 90 tends to move in the printing direction (frontwardly) due to pressure applied by the printing apparatus. In this case, the first movable plate 112 supporting the first edge 91 of the PBC 90 and the first stopper 114 operate such that the PCB 90 does not move frontwardly.

In this case, the PCB 90 is fixed in an opposite manner to the PCB as shown in FIGS. 7 and 8. That is, the first actuator 113 operates to move the first movable plate 112 in an outward direction such that a rear surface of the first movable plate 112 contacts the first stopper 114. When the rear surface of the first movable plate 112 contacts the first stopper 114, the first movable plate 112 is fixed and thus cannot move further in an outward direction since the first stopper 114 limits the outward movement of the first movable plate 112.

When the first movable plate 112 is fixed and thus the first actuator 113 has stopped operating, the second actuator 123 operates to move the second movable plate 122 in an inward direction, thereby pressing or clamping the PCB 90 against the first movable plate 112. As illustrated in FIGS. 9 and 10, the PCB 90 is supported by the support wings 142 and the support pins 143 of the lower support unit 140, but is not fixed. Accordingly, when the second movable plate 122 presses the second edge 92, the PCB 90 moves toward the first movable plate 112 and thus the first edge 91 contacts the first movable plate 112.

In this state, since the first edge 91 of the PCB 90 contacts the first movable plate 112 and the PCB 90 does not move anymore in a forward direction. Accordingly, the PCB supporting apparatus can stably support the PCB 90 during the printing operation.

When the PCB 90 is supported between the first and second fixing units 110 and 120 according to the printing direction, the vacuum nozzle 150 operates to support the PCB 90 such that a vertical orientation thereof is maintained by applying a vacuum pressure to the bottom surface of the PCB 90.

When the supporting of the PCB 90 is established, the PCB 90 may be aligned for a printing operation. In an embodiment, the PCB 90 is aligned for the printing operation with an aligning apparatus 160 that is configured under the base 100 (refer to FIG. 3). The aligning apparatus 160 moves the base 100 in x-axis and y-axis directions or rotates the base 100 to adjust an angle of the base 100, and thereby adjusting a position of the PCB 90 for the printing operation.

When the aligning of the PCB 90 is completed, the printing operation is performed to apply solder paste in a predetermined pattern on a surface of the PCB 90. When the printing operation of the PCB 90 is completed, the PCB 90 is conveyed through the PCB conveying apparatus 130 and discharged from the printing apparatus. Next, another PCB is conveyed through the PCB conveying apparatus 130, and the above-described operations are repeated.

Figure 11:
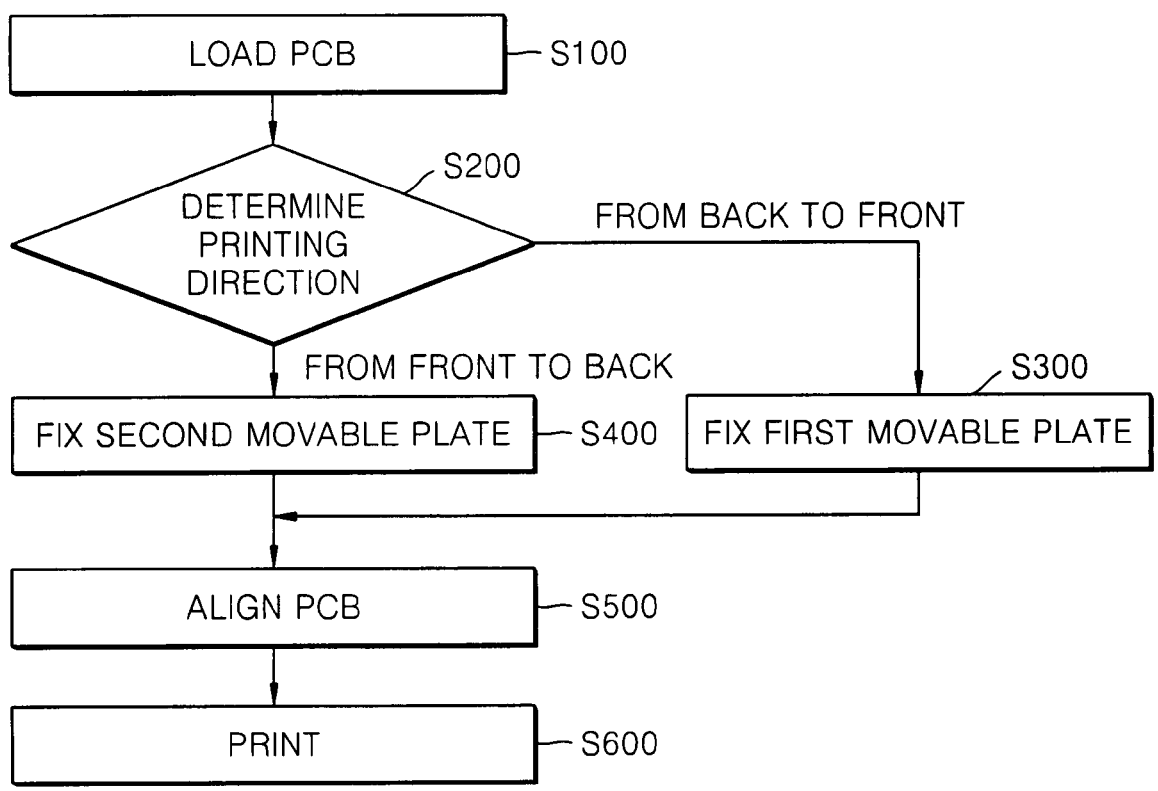
FIG. 11 is a flowchart illustrating an example method of forming a PCB using the PCB supporting apparatus.

FIG. 11 is a flowchart illustrating an example method of forming a PCB according to another aspect of the present invention.

The example method of forming the PCB according to an embodiment of the present invention includes: loading the PCB into a printing apparatus that includes the forgoing-described supporting apparatus with first and second fixing units (S100), determining a printing direction (S200); relative to the determining step, either first fixing of the PCB (S300) or second fixing of the PCB (S400); aligning the PCB (S500) and printing (S600).

In operation S100, the PCB 90 for a printing operation is loaded on a predetermined region of the printing apparatus that includes the forgoing-described supporting apparatus with first and second fixing units, in between the first and second fixing units. The PCB 90, which is supplied to a PCB supporting apparatus, may be, for example, conveyed between the first fixing unit 110 and the second fixing unit 120 by the PCB conveying apparatus 130. Next, the PCB 90 may be moved in an upward direction by the lower support unit 140 so that the height of the PCB 90 is adjusted to generally correspond to the height of the first and second movable plates 112 and 122 of the first and second fixing units 110, 120.

In operation S200, the direction of the printing operation of applying solder paste on a surface of the PCB 90 is determined. The printing direction may be a first direction that proceeds from the first edge 91 of the PCB 90 to the second edge 92 of the PCB 90, or a second direction that proceeds from the second edge 92 of the PCB 90 to the first edge 91 of the PCB 90.

Since pressure is applied to the PCB 90 in the printing direction, an appropriate fixing operation for the PCB is performed depending on the printing direction that is determined in operation S200.

When the printing direction is the second direction, the first fixing operation S300 is performed. That is, the first movable plate 112 of the first fixing unit 110 is fixed to support the first edge 91 of the PCB 90, and the second fixing unit 120 presses the PCB 90 towards the first fixing unit 110.

When the printing direction is the first direction, the second fixing operation S400 is performed. That is, the second movable plate 122 of the second fixing unit 120 is fixed to support the second edge 92 of the PCB 90, and the first fixing unit 110 presses the PCB 90 towards the second fixing unit 120.

When the PCB 90 is fixed between the plates 112, 122, the printing operation S600 is performed. In operation S600, solder paste is applied on a surface of the PCB 90 to have a predetermined pattern. The operation S600 may include or be proceeded by an aligning operation S500. In operation S500, a position of the PCB 90 is adjusted before applying the solder paste. The operation S600 may further include a vacuum applying operation (not shown). In the vacuum applying operation, the vacuum nozzle 150 applies a vacuum to the bottom surface of the PCB 90 to prevent the PCB 90 from moving vertically, for example, after the aligning operation S500.

As described above, according to an apparatus for supporting a PCB and the method of forming the PCB, the PCB can be better supported during a printing operation since the PCB supporting is changed depending on a printing direction.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An apparatus that supports a printed circuit board substrate with opposing first and second edges during printing, the apparatus comprising:
    a first fixing unit including a first movable plate that engages the first edge of the printed circuit board substrate, a first actuator that moves the first movable plate in a first inward direction toward the first edge and a first outward direction away from the first edge, and a first stopper that limits movement of the first movable plate in the first outward direction; and
    a second fixing unit generally parallel with and spaced apart from the first fixing unit, the second fixing unit including a second movable plate that engages the second edge of the printed circuit board substrate, a second actuator that moves the second movable plate in a second inward direction toward the second edge and a second outward direction away from the second edge, and a second stopper that limits movement of the second movable plate in the second outward direction,
    wherein when solder paste is printed on the printed circuit board substrate from the first edge to the second edge, the second actuator moves the second movable plate in the second outward direction to contact the second stopper, and the first actuator moves the first movable plate in the first inward direction to press the printed circuit board substrate toward the second movable plate, and
    when solder paste is printed on the printed circuit board substrate from the second edge to the first edge, the first actuator moves the first movable plate in the first outward direction to contact the first stopper, and the second actuator moves the second movable plate in the second inward direction to press the printed circuit board substrate toward the first movable plate.

2. The apparatus of claim 1, further comprising a PCB conveying apparatus that delivers the printed circuit board substrate between the first and second fixing units.

3. The apparatus of claim 1, further comprising a support unit that supports a bottom surface of the printed circuit board substrate.

4. The apparatus of claim 3 wherein the support unit raises and lowers the printed circuit board substrate to be substantially coplanar with the first and second movable plates.

5. The apparatus of claim 3 wherein the support unit further comprises a vacuum nozzle that applies a vacuum pressure to the bottom surface of the printed circuit board.

6. The apparatus of claim 1 wherein at least one of the first fixing unit and the second fixing unit is movable with respect to the other one of the first fixing unit and the second fixing unit to adjust for a distance between the first and second edges of the printed circuit board substrate.

7. The apparatus of claim 1 wherein at least one of the first and second actuators is a linear actuator.

\* \* \* \* \*

UNITED STATES PATENT AND TRADEMARK OFFICE
CERTIFICATE OF CORRECTION

PATENT NO. : 7,617,587 B2 Page 1 of 1
APPLICATION NO. : 11/708791
DATED : November 17, 2009
INVENTOR(S) : Min-hyun Jo, Weon-woo Nam and Joo-han Kim It is certified that error appears in the above-identified patent and that said Letters Patent is hereby corrected as shown below:

ON THE TITLE PAGE AND COL. 1 LINES 1-2:

In Item (54) replace the title with

APPARATUS FOR SUPPORTING A PRINTED CIRCUIT BOARD SUBSTRATE

Signed and Sealed this

Thirtieth Day of March, 2010

David J. Kappos
*Director of the United States Patent and Trademark Office*